United States Patent [19]
Kasahara

[11] Patent Number: 4,961,014
[45] Date of Patent: Oct. 2, 1990

[54] FILTER CIRCUIT UTILIZING REVERSIBLE COUNTER FOR GENERATING A SATISFACTORY HYSTERESIS

[76] Inventor: Toshiro Kasahara, 2-4-15 Koushi Niigatashi, Niigata, Japan

[21] Appl. No.: 309,423

[22] Filed: Feb. 13, 1989

[30] Foreign Application Priority Data

May 26, 1988 [JP] Japan ................. 63-127183

[51] Int. Cl.⁵ .............. H03B 1/00; H03K 9/06
[52] U.S. Cl. .................. 307/520; 307/523; 307/528; 328/165; 328/167
[58] Field of Search .......... 307/520, 522, 523, 528, 307/269, 265; 328/165, 167, 154

[56] References Cited

U.S. PATENT DOCUMENTS 4,423,383 12/1983 Svendsen ................. 307/269
4,556,842 12/1985 Rosswurm ............... 307/520
4,667,338 5/1987 Toyonaga et al. ........ 377/45

FOREIGN PATENT DOCUMENTS 0243235 10/1987 European Pat. Off. .
0138330 10/1981 Japan .
0087232 5/1982 Japan .
0077717 5/1984 Japan .
0109317 5/1986 Japan .

OTHER PUBLICATIONS

R. C. Mattern, "Incrementing/Decrementing Binary Counter/Register/Decoder", IBM Technical Disclosure Bulletin, vol. 15, No. 5, Oct. 1972, pp. 1716–1719.
A. Jordan, Jr., "Digital Filter", IBM Technical Disclosure Bulletin, vol. 24, No. 9, Feb. 1982, pp. 4860–4861.

Primary Examiner—Stanley D. Miller
Assistant Examiner—Trong Quang Phan
Attorney, Agent, or Firm—Antonelli, Terry, Stout & Kraus

[57] ABSTRACT

A filter circuit uses a reversible counter to eliminate noise from an input signal which changes between high and low levels. The input signal is sampled in response to a clock signal of selected frequency and the reversible counter is incremented by a sampled value at the high level and decremented by a sampled value at a low level. A hysteresis is built into the counting sequence by jumping the count by a predetermined value when the count is incremented over a first threshold value or decremented below a second threshold value.

19 Claims, 9 Drawing Sheets

5 FILTER INPUT SIGNAL

FIG. 2(b)
PRIOR ART

15 FILTER OUTPUT SIGNAL

FIG. 2(c)
PRIOR ART

16 SHAPED SIGNAL

FIG. 7(a)    HYSTERESIS WIDTH = 4 Ts

FIG. 7(b)    HYSTERESIS WIDTH = 3 Ts

FIG. 7(c)    HYSTERESIS WIDTH = 2 Ts

FIG. 7(d)    HYSTERESIS WIDTH = Ts

5 FILTER INPUT SIGNAL

FIG. 12(b)

7 SAMPLING CLOCK SIGNAL

FIG. 12(c)

COUNT VALUE

FIG. 12(d)

32 "L"→"H" THRESHOLD VALUE DETECTING SIGNAL

FIG. 12(e)

33 "H"→"L" THRESHOLD VALUE DETECTING SIGNAL

FIG. 12(f)

34 PRESET COMMAND SIGNAL

FIG. 12(g)

35 PRESET DATA

FIG. 12(h)

6 FILTER OUTPUT SIGNAL

FILTER CIRCUIT UTILIZING REVERSIBLE COUNTER FOR GENERATING A SATISFACTORY HYSTERESIS

BACKGROUND OF THE INVENTION

The present invention relates to a filter circuit, and more particularly to a filter circuit which removes noise from an input signal to thereby obtain an input signal having a satisfactorily shaped waveform.

A control system for a programmable controller and the like receives a state signal indicative of the state or condition of a controlled device or system and then processes such signal to generate and output a required control signal. In this case, the state signal, i.e. an input signal of the control system, typically includes a significant amount of noise, and hence, the noise must be removed from the state signal and then the waveform of such state signal must be shaped, so as to produce the state signal with accuracy and with a timing which permits accurate processing thereof.

Figure 1:
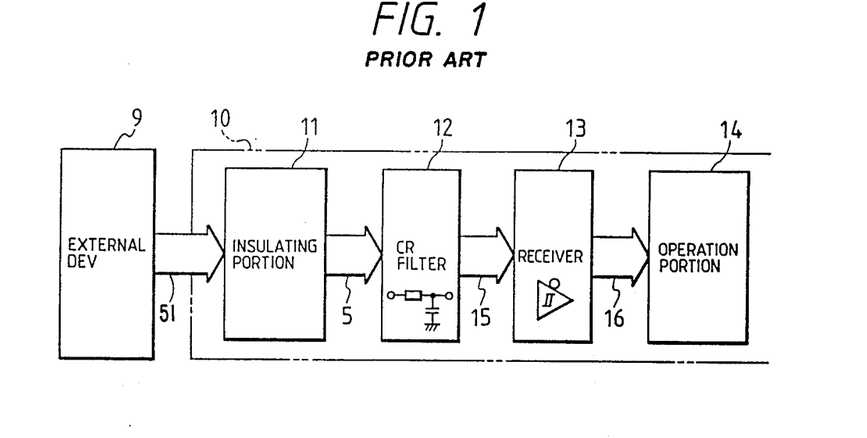
FIGS. 1 and 2(a)–2(c) respectively show a block diagram and time chart indicative of the operation of the input portion of a programmable controller which uses a conventional CR filter.
Figure 2A:
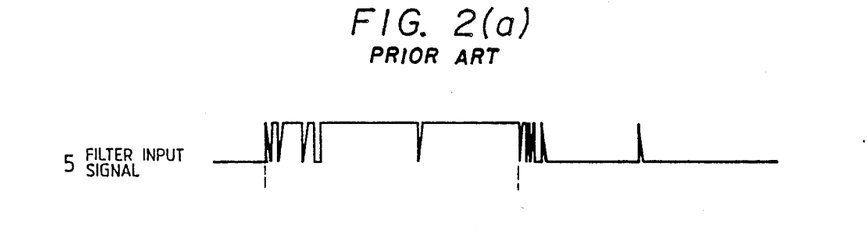
Figure 2B:
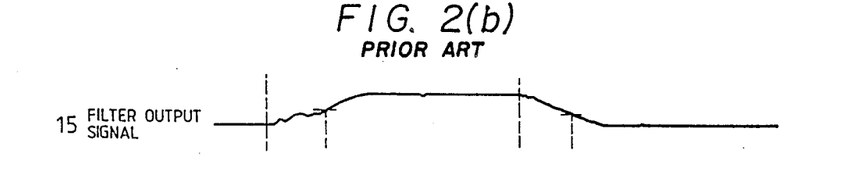
Figure 2C:
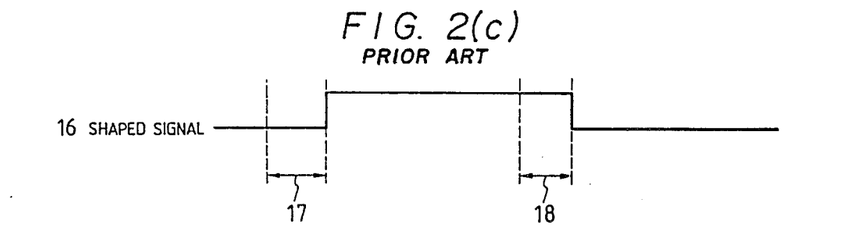

The present invention relates to a filter circuit for performing the above-mentioned operations. One of the examples of a conventional filter circuit is shown in FIG. 1, and the operating waveforms thereof are shown in FIGS. 2(a)-2(c). In FIG. 1, a programmable controller 10 receives a state signal 51 from an external device 9, which may be the controlled device or system. This state signal is subjected to level conversion in a circuit 11, which also provides isolation, so that the state signal 51 is converted into a signal 5, as shown in FIG. 2(a), and this signal 5 is then supplied to a capacitance-resistance (CR) filter 12. In the CR filter 12, the signal 5 is integrated by a capacitor-resistor circuit so that the noise will be removed therefrom. The CR filter 12 outputs the integrated signal as a filter output signal 15, the waveform of which is shaped by a receiver 13 having a hysteresis characteristic. As a result, as seen in FIG. 2(b) and 2(c) the shaped signal has delays 17 and 18, respectively, at the rising and falling portions thereof.

In the conventional circuit shown in FIG. 1, the following inherent problems exist. First, the "L" potential level at the input of the receiver 13 tends to be increased because of the voltage drop across the resistor in the filter circuit 12, with the undesirable possibility that the "1" signal will be misjudged as a "H" signal in the receiver 13. Also, since the charging and discharging waveforms of the capacitor are not uniform, and due to variation of the threshold value of the receiver 13, which depends on the temperature, variation of the delay times 17 and 18 are necessarily large. In addition, the hysteresis characteristic depends on the threshold voltage of the receiver input, so that it is impossible to enlarge the hysteresis width of the receiver 13. Lastly, the capacitor in the filter circuit 12 is not suitable for circuit integration.

Figure 3:
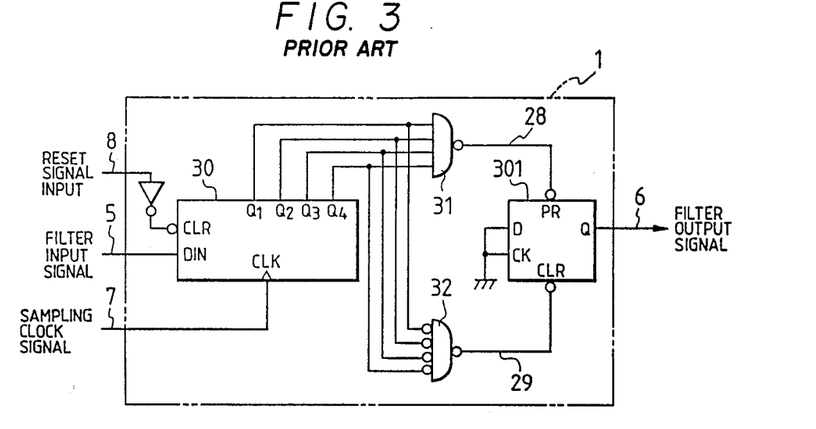
FIGS. 3 and 4(a)–4(e) respectively show a circuit diagram and time chart indicative of the operation of a conventional digital filter using a shift register.

FIG. 3 shows an example of a conventional digital filter circuit, which is disclosed in Japanese Patent Laid-Open Publication No. 61-109317; and, FIGS. 4(a)-4(e) represent a time chart showing the operation of this conventional circuit. A digital filter 1 receives a filter input signal 5, which is sampled at the D input of a shift register 30 driven by a sampling clock 7. If four successive signal samples of the filter input signal 5 are at the "H" level, so that all outputs $Q_1$ to $Q_4$ of the shift register 30 are at the "H" level, an output set signal 28 of level "L" is produced by a NAND gate 31, so that a flip-flop 301 is set. On the other hand, if four successive signal samples of the filter input signal 5 are at the "L" level, so that all outputs $Q_1$ to $Q_4$ are at the level "L", an output reset signal 29 of level "L" is produced by gate 32, so that the flip-flop 301 is reset. The output of this flip-flop 301 is taken out as a filter output signal 6.

Figure 4A:
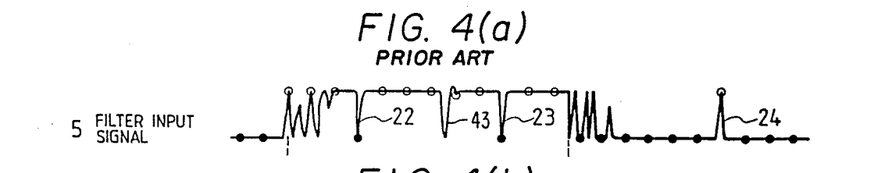
Figure 4B:
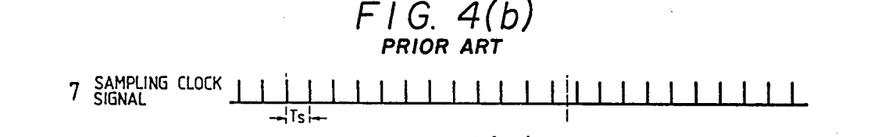
Figure 4C:
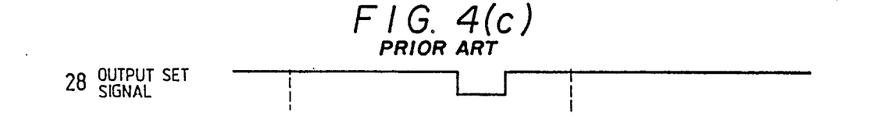
Figure 4D:
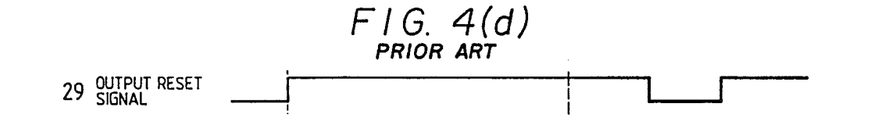
Figure 4E:
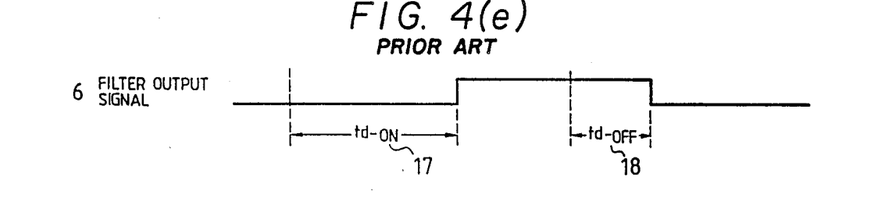

In the conventional circuit shown in FIG. 3, if the noise 22, as shown in FIG. 4(a), is inputted before the output signal 6 is changed over, the output signal 6 may not be set until the sampling data representing the noise sample is shifted out of the shift register 30. In this case, there is a disadvantage in that the turn-on time 17 necessarily becomes large. A similar problem occurs with respect to the turn-off time 18. Hence, these delay times are undesirably affected by the noise. In addition, no consideration is given in this conventional circuit to the possibility of variable setting of the noise removal and delay time characteristic of the filter circuit, which affects the overall speed of operation of the filter circuit.

Meanwhile, Japanese Patent Laid-Open Publication No. 56-114002 discloses a filter circuit which is capable of setting a variable delay time. The noise removal characteristic and delay time can be varied in this conventional circuit by varying the capacitor storage time of a capacitor-resistor filter, and so, the foregoing disadvantages relating to the filter circuit of FIG. 1 are also present in this conventional circuit.

SUMMARY OF THE INVENTION

It is an object of the present invention to provide a stable filter circuit from which a satisfactorily shaped waveform can be obtained.

It is a further object of the present invention to provide a stable filter circuit which is suitable for circuit integration and whose time constant is variable.

The above-mentioned objects can be achieved by providing a reversible counter which counts up or down in response to the "H" or "L" level of the input signal and which skips to an advanced count value when the count value becomes larger than a threshold value to provide an inherent hysteresis characteristic. In addition, the above objects can be achieved by operating a sampling clock generating circuit to generate plural clock signals each having a different frequency, and by selecting one of the plural clock signals having a frequency according to a value set by a time constant setting circuit so that the selected clock signal is set as the clock signal of the above-mentioned reversible counter.

In accordance with one feature of the present invention, the direction of the counting operation of the reversible counter is controlled in response to the "H" and "L" levels of the filter input signal; however, the output of the filter circuit is not changed until the counter value of the reversible counter becomes larger than a predetermined threshold value. For this reason, it is possible to obtain a filter characteristic which operates to remove sharp pulses and the like. Further, this reversible counter skips to an advanced count value at the time when the count value becomes larger than the threshold value, so that the count value does not revert to the count value representing the threshold value immediately, even when a noise signal of opposite polarity is inputted thereto. Hence, it is possible to obtain a stable and satisfactory hysteresis characteristic. In addition, the sampling clock generating circuit generates plural clock signals, one of which is selected and then supplied to the reversible counter. Therefore, it is possible to control the counting operation of the reversible counter and also control the time constant of the filter operation. Moreover, it is easy to stabilize this clock signal, so that any variation of the time constant can be minimized.

BRIEF DESCRIPTION OF THE DRAWINGS

FIGS. 6(a)–6(d) is a time chart showing the operation of the circuit shown in FIG. 5;

DESCRIPTION OF THE PREFERRED EMBODIMENTS

Figure 5:
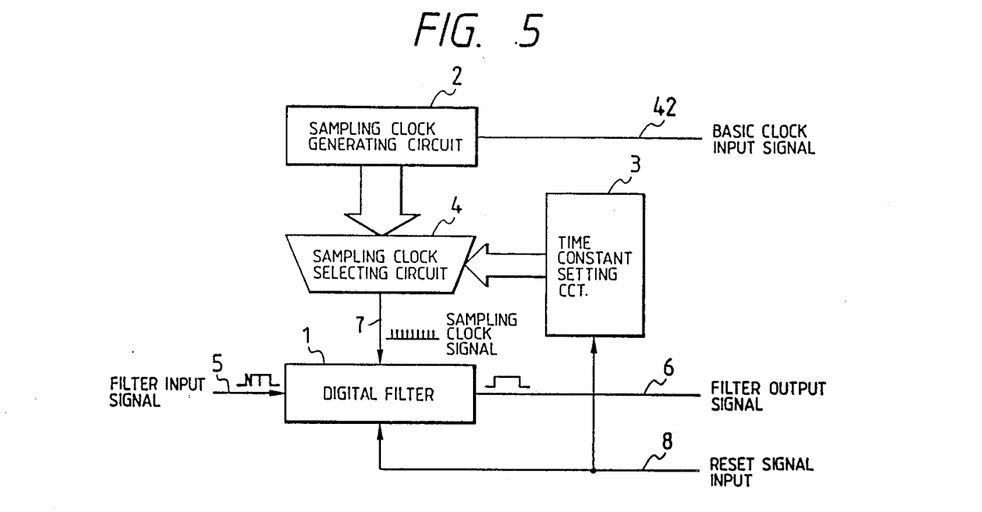
FIG. 5 is a block diagram of one embodiment of the present invention using a reversible counter.

Hereinafter, the present invention will be described in detail with reference to various preferred embodiments. FIG. 5 is a block diagram showing a basic configuration of the filter circuit according to the present invention.

In FIG. 5, a digital filter 1, constituted by an up/down counter, receives a filter input signal 5, which typically includes noise and chattering components therein. The digital filter 1 performs count-up or count-down operations in response to the "H" or "L" level of the filter input signal 5 every time the sampling clock signal 7 is inputted thereto. As a result, the digital filter 1 outputs a filter output signal 6 from which the noise is removed.

One clock signal identified by the time constant (or delay time) setting circuit 3 is selected from plural clock signals of different frequency, which are obtained by dividing a basic clock input signal 42 in a clock signal generating circuit 2 by a sampling clock selecting circuit 4, so that such selected clock signal is set as the sampling clock signal 7 supplied to the digital filter 1.

Figure 6A:
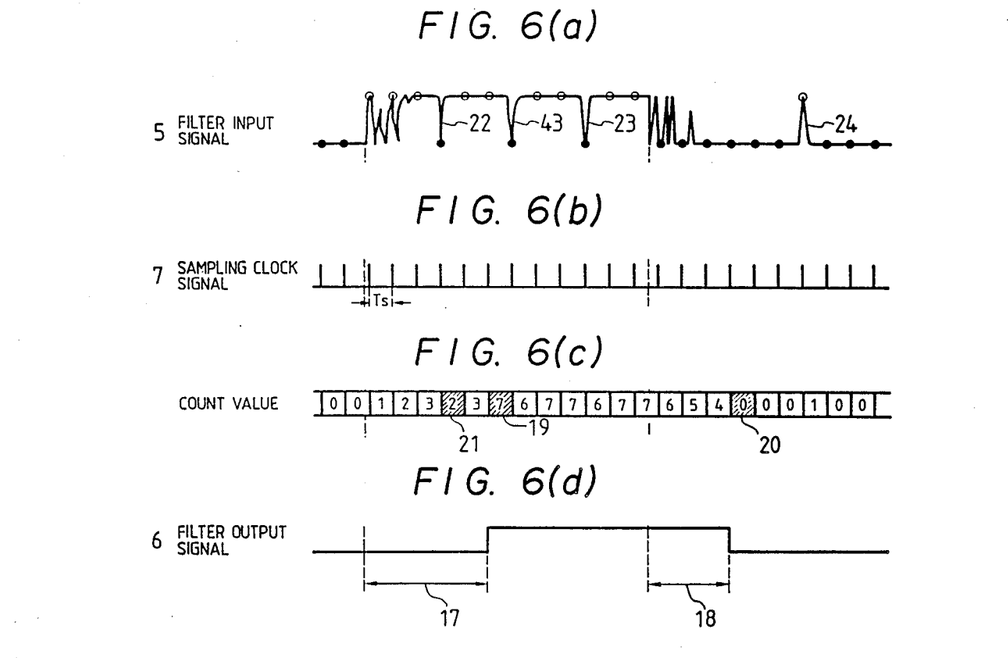

Next, the operation of the filter circuit of FIG. 5 will be described by use of the time chart shown in FIG. 6(a)–6(d). The filter input waveform 5, including the highest degree of noise and chattering etc., is sampled by the sampling clock signal 7, and a count value is incremented when the sampled filter input waveform has the "H" level (as shown by hollow circles), while the count value is decremented when the sampled filter input waveform is at the "L" level (as shown by black circles). In accordance with the present invention, the counting operation is controlled according to the following rules. When the count value is incremented over three, the filter output signal 6 is set to have the "H" level and the count is advanced to seven. When the count value is decremented below four, the filter output signal 6 is set to have the "L" level and the count is jumped to zero. By using an up/down counter in this way, the counter value is changed from zero to one, but is not incremented over three unless the proper succession of positive pulses is detected. Even if a positive pulse (or noise) 24 shown in FIG. 6(a) is inputted to the digital filter 1 during a sequence of negative pulses, the filter output signal 6 is not effected by this positive pulse 24, so that the noise can be removed from the filter input signal 5. Similarly, in the case where negative pulses 22, 23 and 43 etc. are inputted to the digital filter 1 during a succession of positive pulses, the count value is decremented by one for each of these unwanted pulses, but the counting is continued after each unwanted pulse, so that it is possible to remove the effects of these negative pulses from the filter output signal 6.

The pulse removal ability of the filter in accordance with the invention can be expressed by the following equation. For this reason, it is possible to obtain the ideal low-pass filtering characteristic which can remove all pulses having a pulse width satisfying this equation.

(Removable Maximum Pulse Width) =

(Sampling Clock Period: $Ts$) ×

(Count Distance to Threshold Value)

In the present embodiment, it is possible to certainly remove the noise whose pulse width is under 4 Ts. In addition, since the count distance to the threshold value is determined when the circuit is designed, on the basis of the above-mentioned rules for example, the filtering characteristic obtained by the present embodiment will be identified as a function whose value depends on the sampling clock period Ts only. Therefore, in the case where the basic clock signal is generated by use of a crystal oscillator etc., there is an advantage in that it is possible to obtain a stable filtering characteristic having a high accuracy.

Further, it is the characteristic of the present invention that a satisfactory hysteresis characteristic is obtained by setting the counting operation so that it is discontinuous when the count value is incremented over the threshold value. Hereinafter, an example will be given with reference to FIG. 6 similar to the above description.

When the count value is incremented over three, the next count value is not set to four, but is set to seven as shown by time slot 19. Thus, even if the negative pulse 43 is inputted to the digital filter 1 just after the level of the filter output waveform 6 changes to the "H" level, the count value is decremented to six, for example. In this case, there is a gap between the count value of six and the threshold value of four, so that it is possible to prevent the level of the filter output signal from being inverted to the "L" level again by a single pulse of opposite polarity. Similarly, when the count value is decremented below the threshold value, the next count value is not decremented to three, but is set to zero, as shown by time slot 20, so that it is possible to prevent the filter output waveform from being inverted to the positive or "H" level again by a single positive pulse 24. Therefore, no chattering is produced in the filter output waveform 6 as a result of this built-in hysteresis.

In the present embodiment, the hysteresis width is set to 4 Ts (Ts: sampling clock period). However, this hysteresis width can be freely varied from Ts to 4 Ts by varying the count distance to be jumped when the count value is incremented over the threshold value. This is shown in FIGS. 7(a) through 7(d).

Figure 7A:
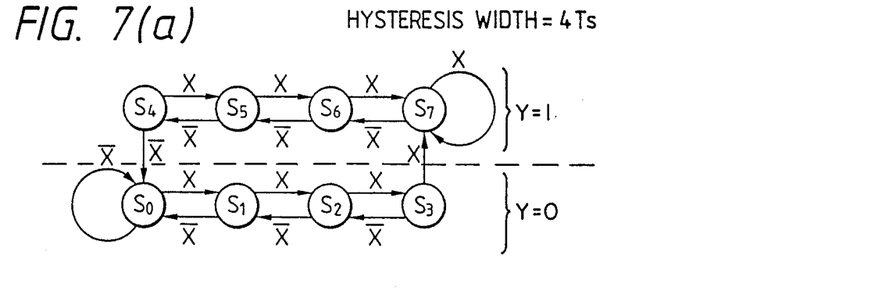
FIGS. 7(a) through 7(d) show several state transition diagrams of the reversible counter shown in FIG. 5.
Figure 7B:
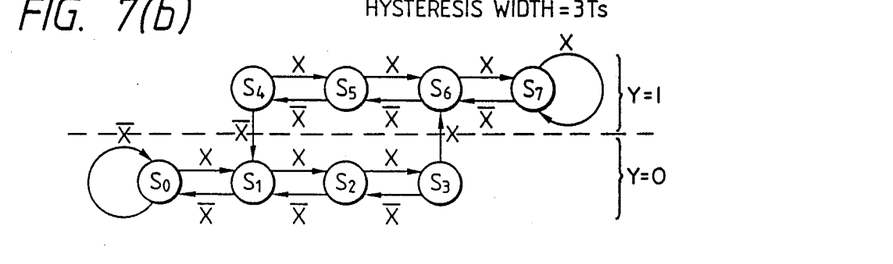
Figure 7C:
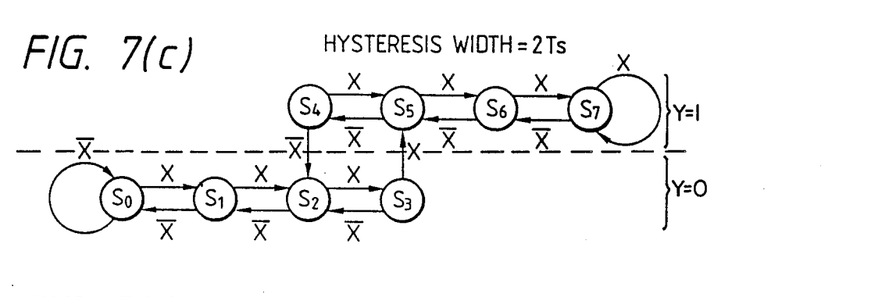
Figure 7D:
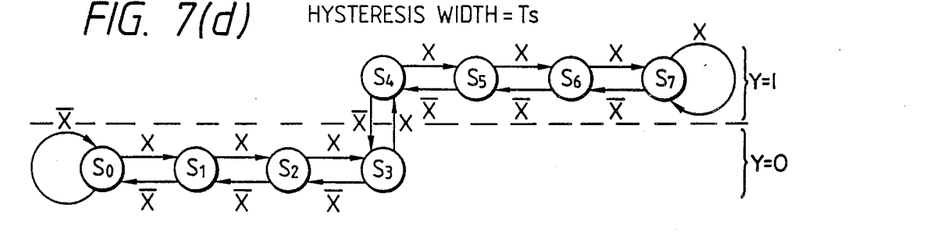

FIGS. 7(a) through 7(d) show state transition diagrams indicating the relation between the counting operation of a reversible counter of three bits and the hysteresis width. In the case where a binary up/down counter is used as the reversible counter, the suffix number "S" directly corresponds to the count value of the up/down counter in each state. The value of the filter output signal Y equals "1" when the count value is over "4", while such value of the filter output signal Y equals "0" when the count value is below "3". In short, the value of the filter output signal Y equals the value of most significant bit (MSB) of the counter. The transition condition depends on the filter input signal at each sampling timing. In FIG. 7, "X" refers to "H" samples, while "X̄" refers to "L" samples. The jump count distance 4, as described in FIG. 6, corresponds to the diagram shown in FIG. 7(a), which is an example for setting the hysteresis width to the maximum FIG. 7(b) illustrates a jump count distance of 3, while FIGS. 7(c) and 7(d) show jump count distances of 2 and 1, respectively. The hysteresis width set as described above depends on N times the sampling clock period, where N is an integer. Hence, there is an advantage in that the present filter is hardly subjected to the effects of temperature variation, which is such a disadvantage in the use of the CR filter.

Figure 8:
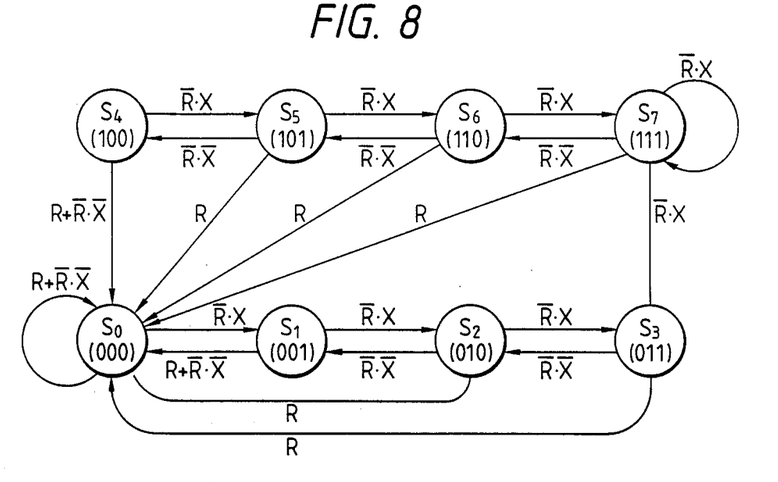
FIGS. 8 and 9 respectively show one specific state transition diagram and an embodiment of a digital filter for realizing such a state transition.

FIG. 8 is a state transition diagram which is obtained by adding a reset operation to the state transition diagram shown in the FIG. 7(a) reset operation responsive to an applied reset signal 8, as shown in FIG. 5. The value in parenthesis in each state indicates the count value of the up/down counter.

Figure 9:
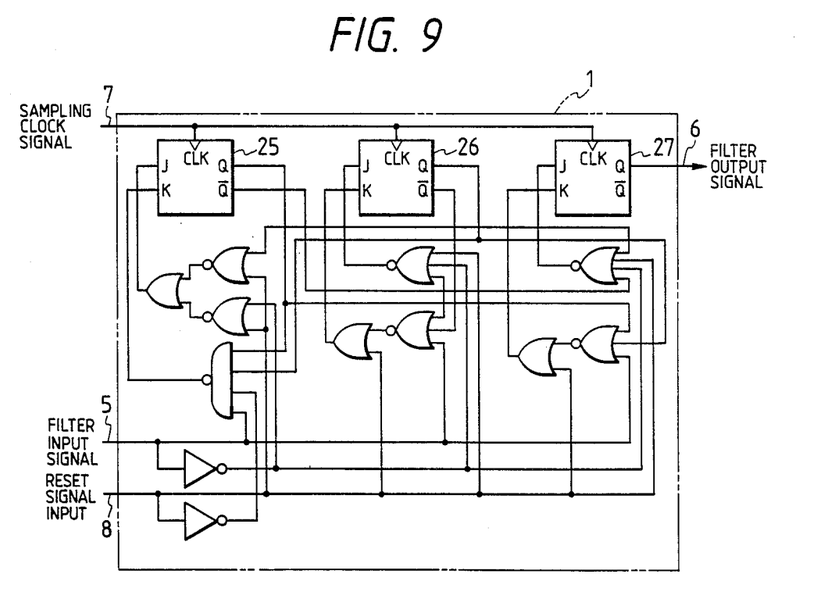

FIG. 9 is a circuit diagram showing an example of a digital filter which is constituted by a master-slave JK flip-flop and which operates according to the state transition diagram of FIG. 8. A JK flip-flop 25 designates the least significant bit of an up/down counter, while a JK flip-flop 26 designates a middle bit and a JK flip-flop 27 designates the most significant bit (MSB) thereof. The reset operation is executed by setting the J input of each flip-flop to the "L" level, and also by setting the K input of each flip-flop to the "H" level. In addition, the counting operation is executed by respectively controlling the J and K inputs of each flip-flop at every sampling clock timing based on the output state of each flip-flop and the state of the input signal 5. In this embodiment, the number of gates is small; hence, this embodiment is not only effective in removing the chattering and noise from applied input signals, but is easy to fabricate.

Figure 10:
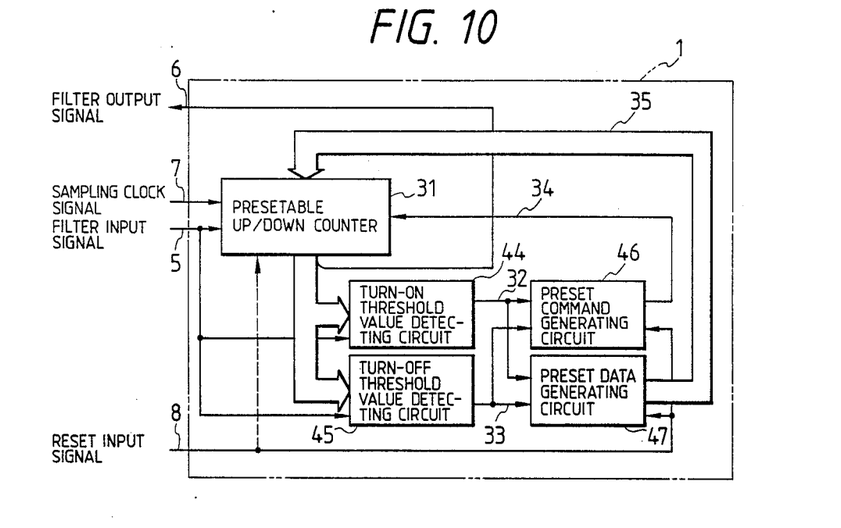
FIG. 10 is a block diagram showing another embodiment of the digital filter according to the present invention using a presetable up/down counter.

FIG. 10 shows another embodiment of the digital filter which is constituted so as to directly control the variation of each bit based on a state transition diagram.

The digital filter 1 shown in FIG. 5 also can be constituted as shown in the block diagram of FIG. 10. The filter input signal 5 is inputted to the presetable up-/down counter 31 to thereby initiate by its logic level a count-up operation mode or a count-down operation mode. The sampling clock signal 7 starts the counting operation, and the output signal of the counter 31 is monitored by threshold value detecting circuits 44 and 45. When the value of this output signal reaches the preset threshold value, the threshold value detecting circuits 44 and 45 output threshold detecting signals 32 and 33. Based on these threshold detecting signals 32 and 33, a preset command generating circuit 46 generates a preset command 34 and a preset data generating circuit 47 generates preset data 35. The preset command 34 and the preset data 35 are supplied to the up/down counter 31. By use of these circuits 44 to 47, the count value is forcibly preset to the proper value depending on the current output of the counter 31, so that the counting operation is executed discontinuously. Hence, it is possible to obtain a satisfactory hysteresis characteristic.

Figure 11:
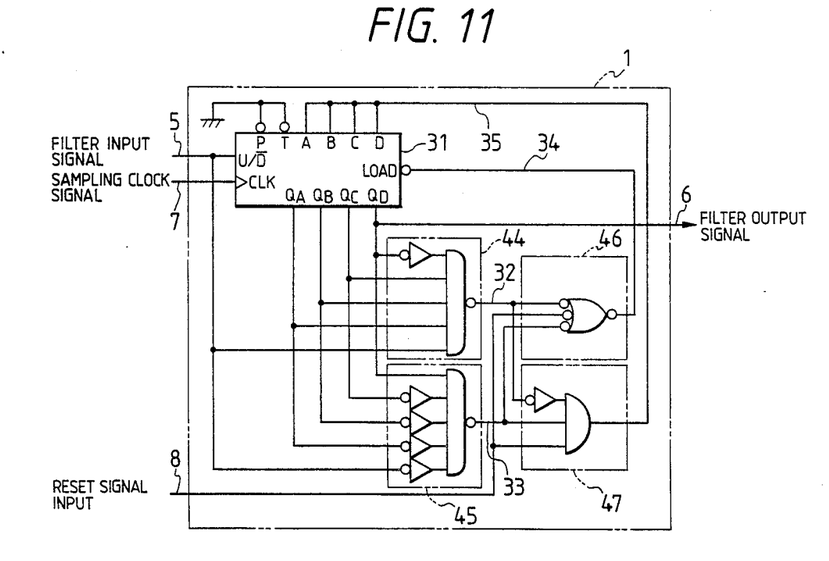
FIGS. 11 and 12(a)–12(h) respectively show a specific example and a time chart indicating the operation of the digital filter shown in FIG. 10.
Figure 12A:
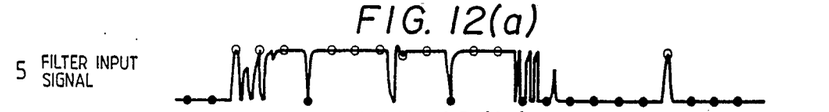
Figure 12B:
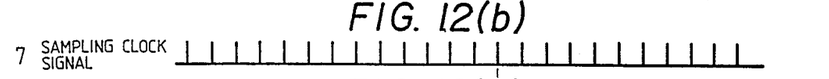
Figure 12C:
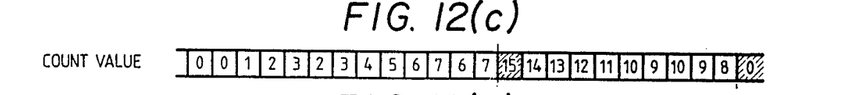
Figure 12D:
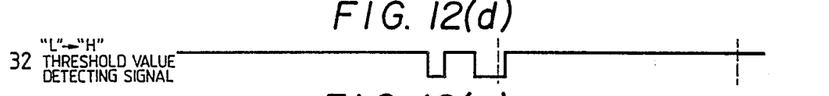
Figure 12E:
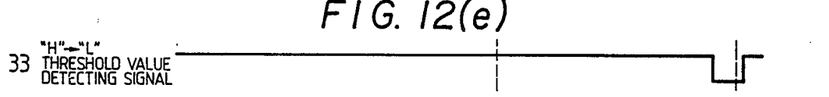
Figure 12F:
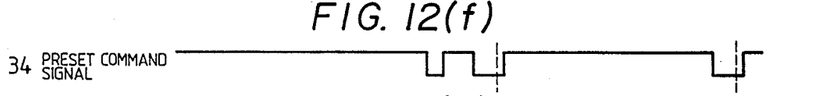
Figure 12G:
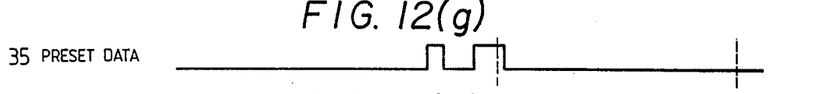
Figure 12H:
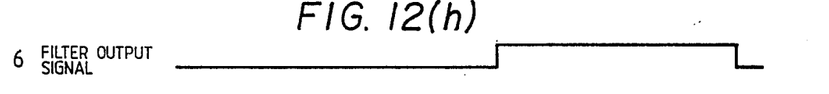

FIG. 11 shows a more specific example of the embodiment shown in FIG. 10. In this embodiment, a synchronous binary up/down counter 31 of four bits is used as the up/down counter so as to provide an operation involving sixteen states, in which the threshold is eight rather than four. In contrast to the circuit shown in FIG. 9, this circuit shown in FIG. 11 uses an ordinary up/down counter. Therefore, in the case where a general-purpose logical IC is used for realizing this embodiment, it can be said that this embodiment provides an advantage because of the small number of elements required.

FIGS. 12(a)-12(h) show a time chart of the operation of the embodiment of FIG. 11. In the case where the level of filter input signal 5 is the "H" level when the count value of counter 31 is seven ($Q_a=1$, $Q_b=1$, $Q_c=1$ and $Q_d=0$), the turn-on threshold value detecting signal 32 takes the "L" level, so that the level of the filter output signal 6 becomes "H" at the input timing of the sampling clock, i.e. as the counter 31 increments. Similarly, in the case where the level of the filter input signal 5 is the "L" level when the count value is eight ($Q_a=0$, $Q_b=0$, $Q_c=0$ and $Q_d=1$), the turn-off threshold value detecting signal 33 takes the logic "L" level so that the level of the filter output signal 6 becomes "L" at the input timing of the sampling clock, i.e. as the counter 31 decrements.

It is possible to perform the reset operation by forcibly presetting the counter to zero by means of the reset signal 8. In the case where there is a reset input to the up/down counter 31, as shown by dotted line in FIGS. 12(a)-12(h), it is possible to perform the reset operation by directly supplying this reset input to the counter. However, in the example of FIG. 11, the output data signal 35 of the preset data generating circuit 47 is set to indicate zero or fifteen depending on the current state of the counter 31. Instead, it is possible to output other values from the preset data generating circuit 47 so that the hysteresis width will become small. For example, the hysteresis width can be reduced from 8 Ts to 7 Ts by presetting the circuit 47 to produce one and fourteen.

In the above-mentioned embodiment, the digital filter is constituted by use of a binary up/down counter. However, the counter to be used in accordance with the present invention is not necessarily limited to a binary up/down counter. The present invention basically uses a reversible counter and provides hysteresis to the state transition at the time the count value is incremented or decremented past a threshold value. Thus, by use of a counter in this way, it is possible to provide a digital filter having a satisfactory hysteresis.

Figure 13:
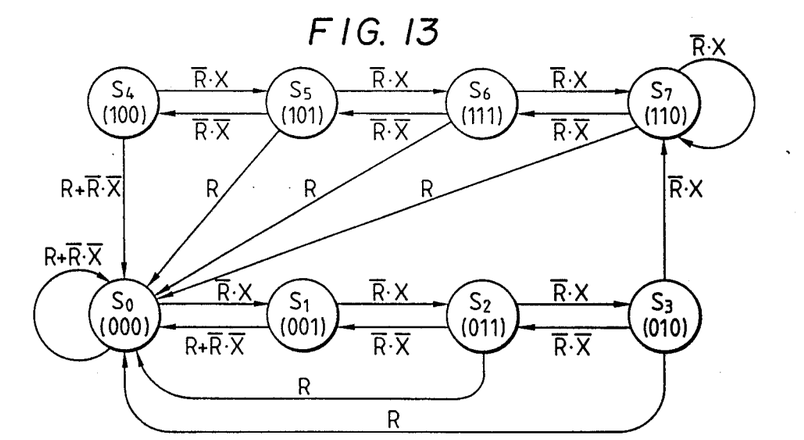
FIG. 13 is a state transition diagram which is obtained by arbitrarily assigning other count values to the states in the state transition diagram shown in FIG. 8.

FIGS. 7(a) through 7(d) described previously are state transition diagrams for a digital filter using a binary up/down counter in the case of eight states, in accordance with the present invention, and FIG. 7(a) shows the largest pulse removal ability and hysteresis width. Similarly, it is possible to produce a state transition diagram having $2^N$ states at maximum by using N flip-flops in general. In this case, the output is subjected to the states shown in the state transition diagram having the hysteresis as shown in FIG. 7(a), but without the use of a binary counter. Thus, it is possible to constitute a digital filter having a pulse removal ability and hysteresis width of $_2$N-1.Ts simply using flip-flops and logic elements. FIG. 13 shows an embodiment based on this concept. In FIG. 13, the value in parentheses in each state indicates one example of an assigned count value corresponding to each state, and an important feature of this invention is that this assignment can be arbitrarily performed. This embodiment shows an example of an assignment according to the characters of m bits in the case where only one bit number must be varied in the transition between the adjacent states. In this regard, a comparison of FIGS. 8 and 13 will show that the count values for the states $S_2$, $S_3$, $S_6$ and $S_7$ are different in the respective diagrams.

Figure 14:
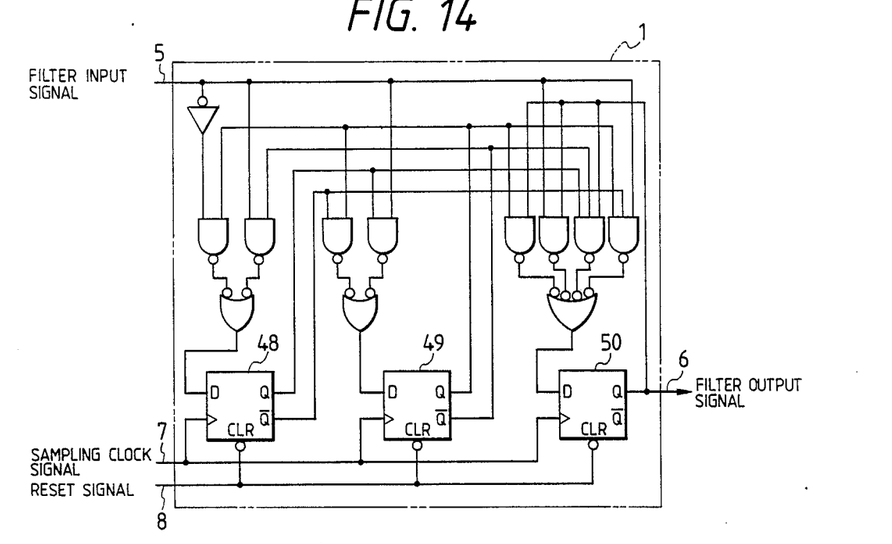
FIG. 14 is a circuit diagram of a filter circuit which operates according to the state transition diagram of FIG. 13.

FIG. 14 shows one of a filter circuit in accordance with the state transition diagram of FIG. 13. In FIG. 14, a D flip-flop 48 designates the least significant bit (LSB), a D flip-flop 49 designates a middle bit, while a D flip-flop 50 designates the most significant bit (MSB). The reset operation is executed by supplying a clear input to the D flip-flop of each bit. The reversible counting operation is executed by controlling the D inputs of the D flip-flops 48 to 50 based on the filter input signal 5 and the output state of each flip-flop. As described above, the reversible counter counts its count value by m bits. Hence, control logic of the input of each bit in the flip-flop can be simplified, and a small number of gates is needed. For this reason, the present embodiment is advantageous for large scale circuit integration (LSI) of a gate array and the like in the case where a significant number of input signals are processed by the filter.

Figure 15:
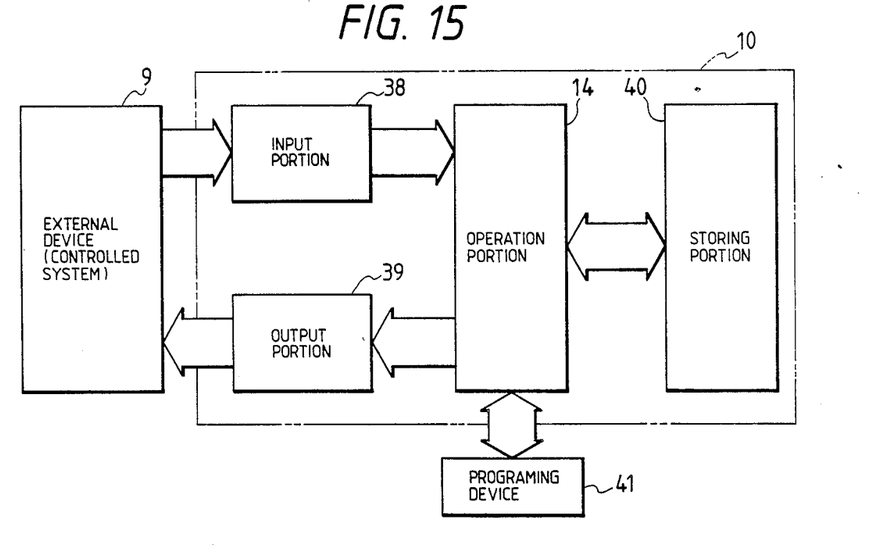
FIG. 15 is a block diagram of programmable controller to which the present invention may be applied.

While the description heretofore has focused on the constitution of the digital filter 1, other features of the filter circuit of the present invention as illustrated in FIG. 5 are worthy of note. For example, the sampling clock generating circuit 2 generates plural sampling clocks each having a different frequency, as mentioned above, and one of these sampling clock signals is selected by the sampling clock selecting circuit 4 in accordance with the value set by the time constant setting circuit 3. Thus, it is possible to vary the period of the sampling clock signal supplied to the digital filter 1, and it is also possible to vary the time constants corresponding to the maximum removal pulse width and input/output delay time. For example, in the time chart shown in FIG. 4, the turn-on delay time 17 is determined by when the output level changes to the "H" level by counting how many times the sampled input level is at the "H" level. Therefore, when the "H" levels are continuously sampled, the delay time becomes equal to 3 Ts to 4 Ts. On the other hand, when the "L" level is sampled only one time during a positive sequence, as shown by the pulse 22 in FIG. 6, the delay time becomes equal to 5 Ts to 6 Ts. On the other hand, one-time sampling of the "L" level greatly enlarges the delay time from 3 Ts to 7 Ts and 8 Ts in the conventional filter circuit shown in FIG. 3. Compared to the conventional filter circuit, it is possible to obtain a stable operation in an advantageous way in accordance with the present invention. Similar advantages relate to the turn-off time 18. In general, the maximum delay time can be expressed by $$\text{(Maximum Delay Time)} = \quad\quad\quad (1)$$

$$\text{(Transition Distance to Threshold Value)} \times$$

$$\text{(Sampling Period: } Ts\text{)}$$

in case where the digital filter is not effected by chattering. As described before, the maximum removable pulse width can be expressed by $$\text{(Maximum Removable Pulse Width)} = \quad\quad\quad (2)$$

$$\text{(Transition Distance to Threshold Value)} \times$$

$$\text{(Sampling Period: } Ts\text{)}$$

so that this maximum removable pulse width takes the same value of the maximum delay time. As described heretofore, both the maximum delay time and the maximum removable pulse width can be expressed by a function whose value depends on the sampling period Ts. For this reason, these values can be varied by varying the sampling period Ts as described in the embodiment shown in FIG. 5. Therefore, in the case where the filter circuit according to the present invention is adopted for an input portion 38 of a programmable controller 10, as shown in FIG. 15, it is possible to reduce the delay time by supplying a sampling clock having a short period to the digital filter when the external device demands a fast response. In FIG. 15, programmable controller 10 includes an output portion 39 and is associated with programming device 41. In addition, in the case where the external device 9 does not demand such a fast response, it is possible to sufficiently remove the noise and chattering by supplying a sampling clock signal having a long period to the digital filter. In the former case, it is important to obtain the response that the sampling period Ts is selected so that the following condition can be satisfied:

$$Ts \leq \text{(Program Scan Time)} \quad\quad\quad (3)$$

The program scan time equals one process time (or one execution time) when the operation portion 14 repeatedly executes a control program stored in a storing portion 40 in the programmable controller 10. Therefore, in the case where the above condition is satisfied, it is possible to perform the operation based on the new input signal data at every process, so that it is possible to practically use the process speed of the operation portion.

In the case where a high speed pulse supplied from a rotary encoder or the like is received to perform a position determining control, speed control or a cutting length control of a roll cut, the following relation must be satisfied in order to input the "L" or "H" level of the input signal:

$$\text{(Maximum Removable Pulse Width)} < \qquad (4)$$

$$\text{(Minimum Period of Input Signal)}/2 =$$

$$\tfrac{1}{2} \times \text{(Maximum Frequency of Input Signal)}$$

Based on the equations (2) and (4), the sampling period Ts must be determined to satisfy the following relation:

$$\text{(State Transition Distance to Threshold Value)} \times \qquad (5)$$

$$\text{(Sampling Period: } Ts) <$$

$$\tfrac{1}{2} \times \text{(Maximum Frequency of Input Signal: } f_{max}) \therefore$$

$$Ts < 1/f_{max} \times \text{(State Transition Distance to Threshold Value)}$$

Meanwhile, in case of an external device in which a speedy response is not demanded, the sampling clock period is set in response to the characteristic of the device connected to the input portion 38 so that the inputted chattering and noise can be sufficiently removed. For example, in the case where bounding of relay contact is around some milli-second order, the maximum removable pulse width can be set to 10 msec. This can be expressed by the following relation:

$$\text{(Maximum Removable Pulse Width)} \geqq (\text{Maximum Pulse Width of Input Noise}) \qquad (6)$$

Hence, based on the relations (2) and (6), the sampling period must be set to the contact so that the following relation will be satisfied:

$$Ts \geqq \text{(Maximum Pulse Width of Input Noise)}/ \qquad (7)$$
$$\text{(State Transition Distance to Threshold Value)}$$

Figure 16:
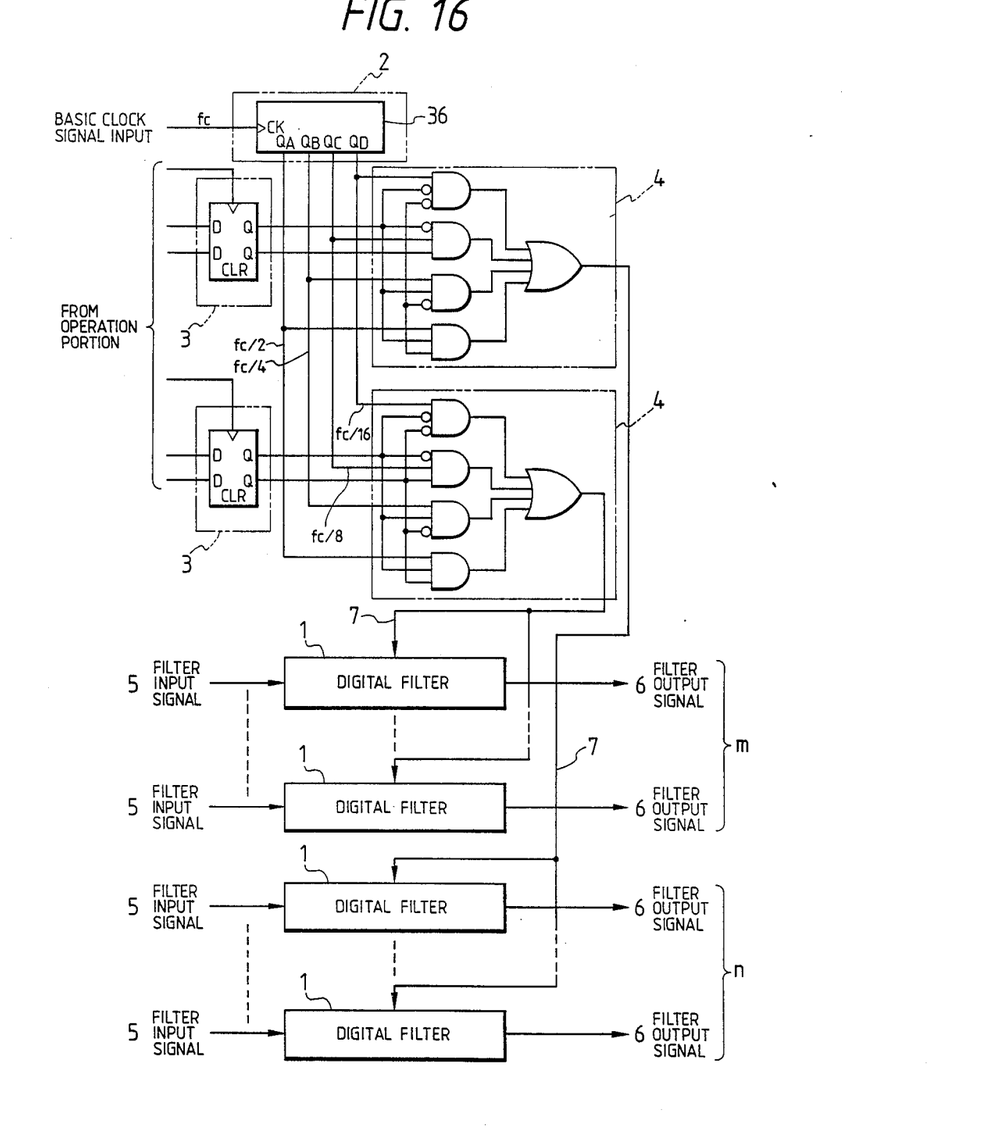
FIG. 16 is a circuit diagram showing one example of the portion which supplies respective clock signals to plural digital filters according to the present invention.

It is possible to provide a plurality of time constant setting circuits 3 and sampling clock selecting circuits 4 by which the different sampling clock signals are supplied respectively to process a plurality of input signals. FIG. 16 shows one embodiment in this case. In this embodiment, two 2-bit registers which can set the value from the operation portion are provided as the time constant setting means 3, a frequency dividing counter is provided as the sampling clock generating circuit 2, and two data selectors which can select one data signal from four inputted data signals are provided as the sampling clock selecting circuit 4. Therefore, different set values are written into two time constant setting registers 3 whose outputs are independently selected by two data selectors 4 to thereby obtain two sampling clock signals 7, which are supplied to plural digital filters 1. Thus, it is possible to shorten the delay time for the filter input signal for which high speed response is demanded. In addition, it is possible to sufficiently remove the noise and chattering from other filter input signals to which such high speed response is not demanded.

Incidentally, it is possible to constitute the time constant setting circuit 3 shown in FIG. 5 by a switch, register or other conventional device. Instead of obtaining the clock signals having different frequencies by dividing the basic clock input signal 42 in the sampling clock generating circuit 2, it is possible to use a known oscillator circuit which directly generates plural clock signals. Further, it is obvious that the sampling clock signal 7 which is supplied to the digital filter 1 can be supplied from a variable frequency oscillator.

Since the present invention has a large hysteresis width and high pulse removal ability, resistance quantities of chattering and noise for the input waveform can be improved. In addition, there are no capacitances included in the circuit according to the present invention, so that a characteristic stabilized against temperature can be obtained and the present invention is suitable for circuit integration. Further, the time constant can be varied by varying the clock frequency, so that it is possible to reduce the delay time for the input signal which needs high speed input. Furthermore, it is possible to obtain an optimum filtering characteristic against the noise which depends on environment and power conditions, and the stability of the delay time can be remarkably improved.

Although the present invention has been described in connection with various preferred embodiments thereof, many other variations and modifications could be made. It is intended to cover all of the variations and modifications which fall within the scope of the present invention, as recited in the following claims.

What is claimed is:

1. A filter circuit comprising:
   clock signal generating means for generating a sampling clock signal;
   a reversible counter connected to said clock signal generating means and including means for sampling an input signal, which changes between high and low levels, in response to the sampling clock signal generated by said clock signal generating means and for performing a count-up operation when a sampled value of said input signal is at the high level and a count-down operation when a sampled value of said input signal is at the low level;
   first control means coupled to said reversible counter for detecting a first threshold value of a count by said reversible counter and for setting the count of said reversible counter to a value equal to said first threshold value plus a predetermined value when said count is incremented over said first threshold value;
   second control means coupled to said reversible counter for detecting a second threshold value of the count by said reversible counter and for setting the count of said reversible counter to a value equal to said second threshold value less said predetermined value when said count is decremented below said second threshold value; and
   means for providing an output of said reversible counter as a filter circuit output.

2. A filter circuit according to claim 1, wherein said reversible counter is a synchronous binary up/down counter.

3. A filter circuit according to claim 2, wherein said first control means and said second control means comprise respective logic gates connecting outputs of said up/down counter to inputs thereof.

4. A filter circuit according to claim 1, wherein said reversible counter includes a plurality of flip-flops interconnected by a logic gate arrangement.

5. A filter circuit according to claim 1, wherein said first threshold value is three, said second threshold value is four and said predetermined value is four.

6. A filter circuit according to claim 1, wherein said first threshold value is seven, said second threshold value is eight and said predetermined value is eight.

7. A filter circuit according to claim 1, wherein said first threshold value is different from said second threshold value, and said predetermined value is equal to said first threshold value.

8. A filter circuit according to claim 1, wherein said first threshold value is different from said second threshold value, and said predetermined value is equal to said second threshold value.

9. A filter circuit according to claim 1, wherein said first threshold value, said second threshold value and said predetermined value are all different from each other.

10. A filter circuit according to claim 1, wherein said clock signal generating means comprises a crystal oscillator.

11. A filter circuit according to claim 1, wherein said clock signal generating means comprises:
generating means for generating a plurality of clock signals each having a different frequency; and
selecting means for selecting one of said clock signals generated by said generating mean and for outputting said selected one clock signal as a sampling clock signal.

12. A filter circuit according to claim 11, wherein said generating means comprises a crystal oscillator connected to a frequency divider.

13. A filter circuit according to claim 1, wherein said reversible counter comprises a plurality of flip-flops interconnected by a logic circuit arrangement to produce a sequence of count states each having an arbitrarily assigned count value.

14. A filter circuit according to claim 13, wherein the count values of said sequence of count states are assigned so that only one bit number is varied in a transition between adjacent count states in said sequence.

15. A filter circuit according to claim 1, wherein the count-up operation and the count-down operation are sequential counting operations.

16. A filter circuit comprising:
clock signal generating means for generating a sampling clock signal;
a reversible counter connected to said clock signal generating means and including means for sampling an input signal, which changes between high and low levels, in response to the sampling clock signal generated by said clock signal generating means, for performing a count-up operation when a sampled value of said input signal is at the high level and a count-down operation when a sampled value of said input signal is at the low level, and for providing an output as a filter circuit output based on the relationship between a count by said reversible counter and first and second threshold values of the count;
first control means coupled to said reversible counter for detecting the first threshold value of the count by said reversible counter and for setting the count of said reversible counter to a value equal to said first threshold value plus a predetermined value when said count is incremented over said first threshold value; and
second control means coupled to said reversible counter for detecting the second threshold value of the count by said reversible counter and for setting the count of said reversible counter to a value equal to said second threshold value less said predetermined value when said count is decremented below said second threshold value.

17. A filter circuit according to claim 16, wherein the count-up operation and the count-down operation are sequential counting operations.

18. A filter circuit comprising:
clock signal generating means for generating a sampling clock signal;
a reversible counter connected to said clock signal generating means and including means for sampling an input signal, which changes between high and low levels, in response to the sampling clock signal generated by said clock signal generating means, for performing a count-up operation when a sampled value of said input signal is at the high level and a count-down operation when a sampled value of said input signal is at the low level, and for providing an output as a filter circuit output based on the relationship between a count by said reversible counter and a threshold value of the count;
first control means coupled to said reversible counter for detecting the threshold value of the count by said reversible counter and for setting the count of said reversible counter to a value equal to said threshold value plus a predetermined value when said count is incremented over said threshold value; and
second control means coupled to said reversible counter for detecting the threshold value of the count by said reversible counter and for setting the count of said reversible counter to a value equal to said threshold value less said predetermined value when said count is decremented below said threshold value.

19. A filter circuit according to claim 18, wherein the count-up operation and the count-down operation are sequential counting operations.

* * * * *